United States Patent [19]

Heydecke et al.

[11] Patent Number: 4,968,388
[45] Date of Patent: Nov. 6, 1990

[54] PROCESS AND APPARATUS FOR MAKING A METAL STRUCTURED FOIL

[75] Inventors: Jens Heydecke, Letteallee; Horst Blasing, Strünckweg, both of Fed. Rep. of Germany

[73] Assignee: Schering Aktiengesellschaft, Berlin & Bergkamen

[21] Appl. No.: 412,844

[22] Filed: Sep. 26, 1989

[30] Foreign Application Priority Data

Sep. 26, 1988 [DE] Fed. Rep. of Germany ....... 3832957

[51] Int. Cl.$^5$ .......................... C25D 1/04; C25D 17/00
[52] U.S. Cl. ........................................ 204/13; 204/208
[58] Field of Search ........................... 204/13, 208

[56] References Cited

FOREIGN PATENT DOCUMENTS 2024112 12/1971 Fed. Rep. of Germany .

Primary Examiner—T. M. Tufariello
Attorney, Agent, or Firm—Michael J. Striker

[57] ABSTRACT

The continuous process for making a metal structured foil, especially a flat conductor line, a flexible circuit board and a heating foil, by chemically and electrochemically metallizing a nonconductor foil, comprises the steps of:

a. chemically metallizing both sides of the nonconductor foil to form a metal layer on both sides, b. coating an activated surface which is not to be metallized, c. electrolytically removing the metal layer on edge regions of the rear side of the foil and from a plurality of surfaces not to be reinforced electrochemically on the front side(operating side) or on both sides, and d. cathodically polarizing the front side(operating side) of the foil by a current-carrying roller and simultaneously performing an electrochemical bath metallization, whereby chemical dissolution of the metal layers on the rear side and electrochemical reinforcement of the chemically metallized surfaces on a free portion of the front side(operating side) or both sides occurs.

11 Claims, 1 Drawing Sheet

PROCESS AND APPARATUS FOR MAKING A METAL STRUCTURED FOIL

BACKGROUND OF THE INVENTION

Our invention relates to a process for making a metal structured foil, particularly a flat conductor line, a flexible circuit board and a heating foil, by chemically and electrochemically metallizing a nonconductor foil in a continuous process. It also relates to an apparatus for performing that process.

This type of metal structured foil is particularly useful as the socalled flat conductor line for flexible connection of circuit boards and control units in electrical engineering, which according to the current state of the art can only be made in a comparatively expensive way by discontinuous lamination of strip lines, flexible circuit boards and heating foils.

SUMMARY OF THE INVENTION

Accordingly, it is an object of our invention to provide a new simpler method for continuous manufacture of a metal structured foil, especially a flat conductor line, a flexible circuit board and a heating foil.

In keeping with these objects and with others which will become apparent hereinafter, this process or method comprises
 a. chemically metallizing both sides of a continuously running foil,
 b. coating the activated surface which is not to be metallized,
 c. electrolytically removing the metal layer at edge regions of the foil rear side and on the surfaces not to be reinforced electrochemically on the foil front side(operating side) or advantageously on both sides, and
 d. cathodically polarizing the foil front side(operating side) by a current-carrying roller and simultaneously performing an electrochemical bath metallization, whereby chemical dissolution of the metal layers on the foil rear side and electrochemical reinforcement of the chemically metallized surfaces on the free front side(operating side) or both sides occurs.

Various embodiments of our invention are also possible. Metal layers may be removed using electrolyte resistant fluid carriers, advantageously containing acids or alkalis.

Our method advantageously also comprises connecting the fluid carrier with a direct current source in a circuit with the foil rear side, whereby the foil is connected anodically and the fluid carrier is connected cathodically. With this arrangement the applied voltage should advantageously be from about 0.1 to 24 volts.

The chemical and/or electrochemical metallization referred to above can occur in a known metallizing bath, advantageously a chemical copper bath or an acid electrochemical copper bath.

The above-described process of our invention may be used to make copper structured polyimide foil and is of special value when applied in that way.

Our invention also includes an apparatus to perform the above-described process.

The process according to our invention allows manufacture of metal structured foil in a continuous process or method in a way which up to now has not been possible.

Polyimide, polyamide, polyetherimide and polyethersulfone, polyparaphenylenesulfide, polyester and fluorinated polymers, such as polytetrafluoroethylene, are suitable as the nonconductor foils to be used in the process according to our invention.

BRIEF DESCRIPTION OF THE DRAWING

The objects, features and advantages of our invention will be made more apparent from the following detailed description, reference being made to the accompanying drawing in which.

DETAILED DESCRIPTION OF THE INVENTION

In the accompanying drawing A indicates the foil front side(Pi=polyimide; Ch—Cu=chemical and G—Cu=electrochemical copper) and B indicates the foil rear side. Reference number 1 indicates the container for chemical metallization; 2. the device for electrolytic removal of metal by a stable shaped fluid carrier(pad); 3. Container for electrochemical metallization and chemical removal; and 4. Contact rollers for cathodic polarization. The nonconducting foil runs continuously through the container 1, the device 2 and then through the container 3.

The following examples serve for illustration of the process according to our invention.

EXAMPLE 1

A polyimide foil experiences a surface treatment process for nonconductor foils which is known in itself and which includes chemical copperization with a layer thickness of about 0.04 micrometers.

After the rinsing process the foil is surface dried. Subsequently the copper layer is removed in the edge region of the foil rear side electrolytically.

For this purpose acid-resistant fiber or felt pens, which are filled with about 10% $H_2SO_4$, are used.

The strip width depends on the width of the felt pen tip. The pens are connected with a source of direct current in a circuit with the foil rear side. Thus the foil is anodically connected while the pens are cathodically connected.

The reaction at the felt pen tip is as follows:

$$Cu^o + H_2SO_4 \longrightarrow CuSO_4 + H_2$$

The necessary voltage is between 0.10 and 24 volts, depending on the kind of felt pen and electrical connection.

Figure 1:
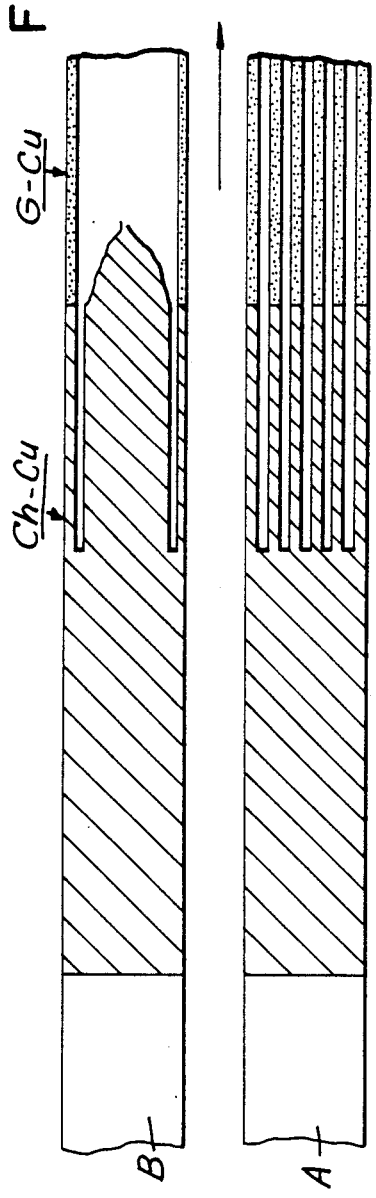
FIG. 1 is a schematic cross sectional view of the metal structured foil made by the process according to our invention.
Figure 2:
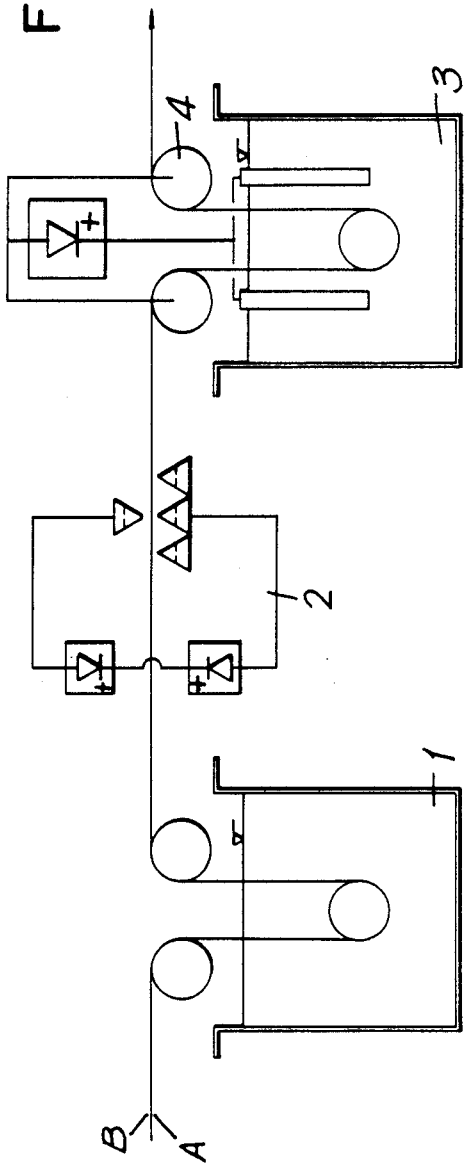
FIG. 2 is a schematic diagram of an apparatus performing the process according to our invention.

The foil so treated enters an electrochemical module, where it is polarized cathodically on the operating(front) side by the first current-carrying roller. The current flow from the contacting roller to the remaining central strip on the foil rear side must now take a path to just up to the etching pen(see FIG. 2). The voltage measured at the entrance in the electrochemical module drops to about 0.20 volts because of the comparatively high resistance of the 0.04 m thick copper layer.

The voltage drop is thus a function of the foil, the layer thickness and the electrical properties of the copper layer between strip etching device and the bath surface of the electrochemical module. 1 micrometer is sufficient to attain a redissolving of the copper layer on the foil rear side.

The electrical potential is not enough to thicken or reinforce the copper layer electrochemically on the rear side of the foil. Because of this the central strip dissolves in the acid copper bath.

To make flat conductor lines strips on the operating side are additionally made according the same electrolytic redissolving process.

EXAMPLE 2

The activated foil is coated on the surfaces not be metallized(holes and so forth). The unprotected surfaces are chemically and electrochemically coated according to the described process to form a metal structured foil.

It will be understood that each of the elements described above, or two or more together, may also find a useful application in other types of constructions differing from the types described above.

While the invention has been illustrated and described as embodied in a process and apparatus for making a metal structured foil, it is not intended to be limited to the details shown since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of the prior art, fairly constitute essential characteristics of the generic or specific aspects of this invention.

What is claimed as new and desired to be protected by Letters Patent is set forth in the appended claims.

What is claimed is:

1. A continuous process for making a metal structured foil by chemically and electrochemically metallizing a nonconductor foil having a front side and a rear side with a plurality of edge regions, comprising the steps of:
   a. chemically metallizing both of said sides of said nonconductor foil to form a metal layer on both of said sides,
   b. coating an activated surface which is not to be metallized,
   c. electrolytically removing said metal layer on said edge regions of said rear side of said foil and from a plurality of surfaces not to be reinforced electrochemically on said front side of said foil, and
   d. cathodically polarizing said front side of said foil by a current-carrying roller and simultaneously performing an electrochemical bath metallization, whereby chemical dissolution of said metal layer on said rear side of said foil and electrochemical reinforcement of said chemically metallized front side occurs.

2. A continuous process according to claim 1, wherein said electrolytic removing of said metal layer occurs using an electrolytically resistant fluid carrier.

3. A continuous process according to claim 2, wherein said electrolytically resistant fluid carrier is filled with an acid.

4. A continuous process according to claim 2, wherein said electrolytically resistant fluid carrier is filled with an alkali.

5. A continuous process according to claim 3, further comprising connecting said fluid carrier with a direct current source having a voltage in a circuit with said rear side of said foil formed so that said foil is connected anodically and said fluid carrier is connected cathodically.

6. A continuous process according to claim 5, wherein said voltage amounts to from 0.1 to 24 volts.

7. A continuous process according to claim 1, wherein said chemical metallizing occurs in a copper bath.

8. A continuous process according to claim 1, wherein said electrochemical metallizing occurs in an acidic electrochemical copper bath.

9. A continuous process according to claim 1, further comprising electrolytically removing said metal layer on said edge regions of said rear side of said foil and from a plurality of surfaces not to be reinforced electrochemically on said rear side of said foil.

10. A continuous process for making a copper structured foil by chemically and electrochemically copperizing a polyimide foil having a front side and a rear side with a plurality of edge regions, comprising the steps of:
    a. chemically copperizing both of said sides of said polyimide foil to form a copper layer on both of said sides,
    b. coating an activated surface which is not to be copperized,
    c. electrolytically removing said copper layer on said edge regions of said rear side of said foil and from a plurality of surfaces not to be reinforced electrochemically on said front side of said foil using an electrolytically resistant fluid carrier, connecting said fluid carrier with a direct current source in a circuit with said rear side of said foil formed so that said foil is connected anodically and said fluid carrier is connected cathodically, and
    d. cathodically polarizing said front side of said foil by a current-carrying roller and simultaneously performing an electrochemical bath copperization, whereby chemical dissolution of said metal layers on said rear side of said foil and electrochemical reinforcement of a free portion of said front side occurs.

11. An apparatus for performing a continuous process for making a metal structured foil by chemically and electrochemically metallizing a nonconductor foil having a front side and a rear side with a plurality of edge regions, comprising the steps of:
    a. chemically metallizing both of said sides of said nonconductor foil to form a metal layer on both of said sides,
    b. coating an activated surface which is not to be metallized,
    c. electrolytically removing said metal layer on said edge regions of said rear side of said foil and from a plurality of surfaces not to be reinforced electrochemically on said front side of said foil or on both of said sides, and
    d. cathodically polarizing said front side of said foil by a current-carrying roller and simultaneously performing an electrochemical bath metallization, whereby chemical dissolution of said metal layers on said rear side of said foil and electrochemical reinforcement of the chemically metallized surfaces on a free portion of said front side or both of said sides occurs.

* * * * *